United States Patent [19]

Nishino

[11] Patent Number: 5,025,419
[45] Date of Patent: Jun. 18, 1991

[54] INPUT/OUTPUT CIRCUIT
[75] Inventor: Yoichi Nishino, Kanagawa, Japan
[73] Assignee: Sony Corporation, Tokyo, Japan
[21] Appl. No.: 331,275
[22] Filed: Mar. 30, 1989
[30] Foreign Application Priority Data Mar. 31, 1988 [JP] Japan .................................. 63-079558
Jul. 25, 1988 [JP] Japan .................................. 63-185995

[51] Int. Cl.⁵ ...................... G11C 19/00; H03K 17/56;
G06M 1/22; H02H 3/20
[52] U.S. Cl. ..................................... 365/221; 365/220;
365/240; 365/189.12; 365/238.5; 307/240;
307/241; 377/77; 377/80; 361/91
[58] Field of Search ...................... 365/219, 239, 238.5,
365/230.04, 189.12, 230.03, 220, 221; 307/475,
239, 240, 241, 242, 272.2, 273, 271, 272.1;
361/91; 377/77, 80

[56] References Cited

U.S. PATENT DOCUMENTS 3,819,952 6/1974 Enomoto et al. ...................... 361/91
4,527,213 7/1985 Ariizumi ................................ 361/91
4,775,990 10/1988 Kamuro et al. ...................... 365/219
4,800,530 1/1989 Itoh et al. ......................... 365/230.04

Primary Examiner—James W. Moffitt
Assistant Examiner—Michael A. Whitfield
Attorney, Agent, or Firm—Philip M. Shaw, Jr.

[57] ABSTRACT

An input/output circuit wherein a plurality of data lines are provided with a serial/parallel conversion means common to all, so that the circuit is enabled to consume less power and draw a reduced instantaneous current in its operation and be fabricated in an integrated circuit form.

7 Claims, 8 Drawing Sheets

INPUT/OUTPUT CIRCUIT

BACKGROUND OF THE INVENTION

1. Field of the Invention

The present invention relates to an input/output circuit suitable for use in a memory circuit for storing, for example, image data.

2. Description of the Prior Art

Conventionally, in a memory circuit of the described type, it has been the practice that input image data is written in a memory element after the transfer rate of the data has been converted to a lower frequency, and the data is read out of the memory element at the lower frequency and output after its transfer rate is converted to a higher frequency, and thereby, positive storage of the image data is ensured even if a memory element of a slower write and read speed is used (NIKKEI ELECTRONICS, 1985.3.11, pp. 219-239).

More particularly, referring to FIG. 3, reference numeral 1 denotes the whole of a memory circuit, and therein, each one-bit data of $D_{G1}$–$D_{G8}$ constituting 8-bit image data $D_G$ is separately supplied to a serial/parallel conversion circuits 2A–2H, respectively.

As shown in FIG. 4, each of the serial/parallel conversion circuits 2A–2H is made up of D flip-flop circuits 3A to 3N of a master-slave type connected in series and adapted to acquire the data at the timing synchronized with a clock signal $S_{CK}$ of the image data $D_G$ and the data $D_{G1}$ to $D_{G8}$ are adapted to be supplied to the D flip-flop circuit 3A at one end.

Consequently, the data $D_{G1}$ to $D_{G8}$ are each sequentially transferred to the adjoining D flip-flop circuits, from the D flip-flop circuit 3A at one end toward the D flip-flop circuit 3N at the other end, at the timing synchronized with the clock signal $S_{CK}$. By arranging the data to be entered into memory blocks 4A to 4H (FIG. 3) at intervals of predetermined periods of the clock signal $S_{CK}$, it is possible to write the image data $D_G$ into the memory blocks 4A to 4H at a low frequency converted from the transfer rate of the image data $D_G$ at a high frequency.

Conversely, by reading out the data from the memory blocks 4A to 4H and outputting the same through the parallel/serial converters, it is possible to read out data at a low frequency and output the image data $D_G$ at a transfer rate converted to a high frequency.

There are problems with such input/output circuits using serial/parallel conversion circuits and parallel/serial conversion circuits that power consumption therein is large and a large instantaneous current is drawn thereby.

More particularly, in such master-slave type D flip-flop circuits formed of CMOS (complementary metal oxide semiconductor) devices, each circuit consumes tens of μW/MHz/bit of power.

Further, in practice, when 30 MHz or so of image data is to be positively written into or read out from a memory element, 700 or so serially connected D flip-flop circuits become necessary for one bit of the image data.

Hence, 700 mW or so of power is totally consumed for one bit of the image data and this presents a problem of difficulty in arranging the circuit elements in the form of an integrated circuit.

Besides, in a D flip-flop circuit of the described type, 0.1 mA or so of instantaneous current flows for each circuit on the leading edge and the trailing edge of the clock signal $S_{CK}$, and since the D flip-flop circuits constituting an input/output circuit in question operate in synchronism with the clock signal $S_{CK}$, there has been a problem that a total of 70 mA or so of instantaneous current flows.

As a means to solve this problem, there is known a method to use a serial/parallel conversion circuit 5 as shown in FIG. 5 and FIG. 6.

That is, data $D_{G1}$ to $D_{G8}$ are passed through a selector circuit 7, whose contacts are switched over in synchronism with the clock signal $S_{CK}$ (FIG. 6(A)), and thereby supplied to two channels of serially connected D flip-flop circuits 8A to 8M and 9A to 9M.

The D flip-flop circuits 8A to 8M and 9A to 9M are adapted to transfer data $D_{G1}$–$D_{G8}$ sequentially in synchronism with a clock signal $S_{CK2}$ (FIG. 6(B)), whose frequency is that of the clock signal $S_{CK}$ divided by 2, and it is thereby possible to drive the D flip-flop circuits 8A to 8M and 9A to 9M at the low frequency and obtain data at this low frequency.

As a result, the consumed power can be reduced by ½ corresponding to the arrangement to use the clock signal $S_{CK2}$ for the D flip-flop circuits 8A to 8M and 9A to 9M obtained by dividing the frequency of the clock signal $S_{CK}$ by 2.

Even if such an arrangement is used, the instantaneous current cannot be reduced and there still remains a practical difficulty in providing the circuit elements in the form of an integrated circuit.

Further, as shown in FIG. 7, the D flip-flop circuit of the described type is structured of transition gates 11 and 12 each thereof being formed of two CMOS transistors, inverting amplifiers 13, 14, and 15, each similarly formed of two CMOS transistors, and latch circuits 16 and 17 each formed of four CMOS transistors, and therefore, 18 transistors in all are used for the structure.

Hence, when 700 D flip-flop circuits are used for one bit as mentioned above, a total of a hundred thousand transistors will become necessary for processing 8-bit image data. When these are to be arranged on an integrated circuit, the area on one chip occupied by the D flip-flop circuits becomes larger, and this has involved a problem for the chip to become larger in size accordingly.

SUMMARY OF THE INVENTION

The input/output circuit according to the present invention is adapted such that one set each of plural sets of data lines thereof is successively selected for outputting or inputting data, and it is thereby made possible, when the circuit is formed into an integrated circuit, to obtain one of small size, consuming low power and drawing a small instantaneous current.

BRIEF DESCRIPTION OF THE DRAWINGS

FIGS. 8(A) and 8(B) show an embodiment of an input protection circuit according to the present invention, of which FIG. 8(A) is a circuit diagram and FIG. 8(B) is a plan view of MOS transistors;

DETAILED DESCRIPTION OF THE PREFERRED EMBODIMENTS

An embodiment of the present invention will be described below in detail with reference to the accompanying drawings.

Figure 1:
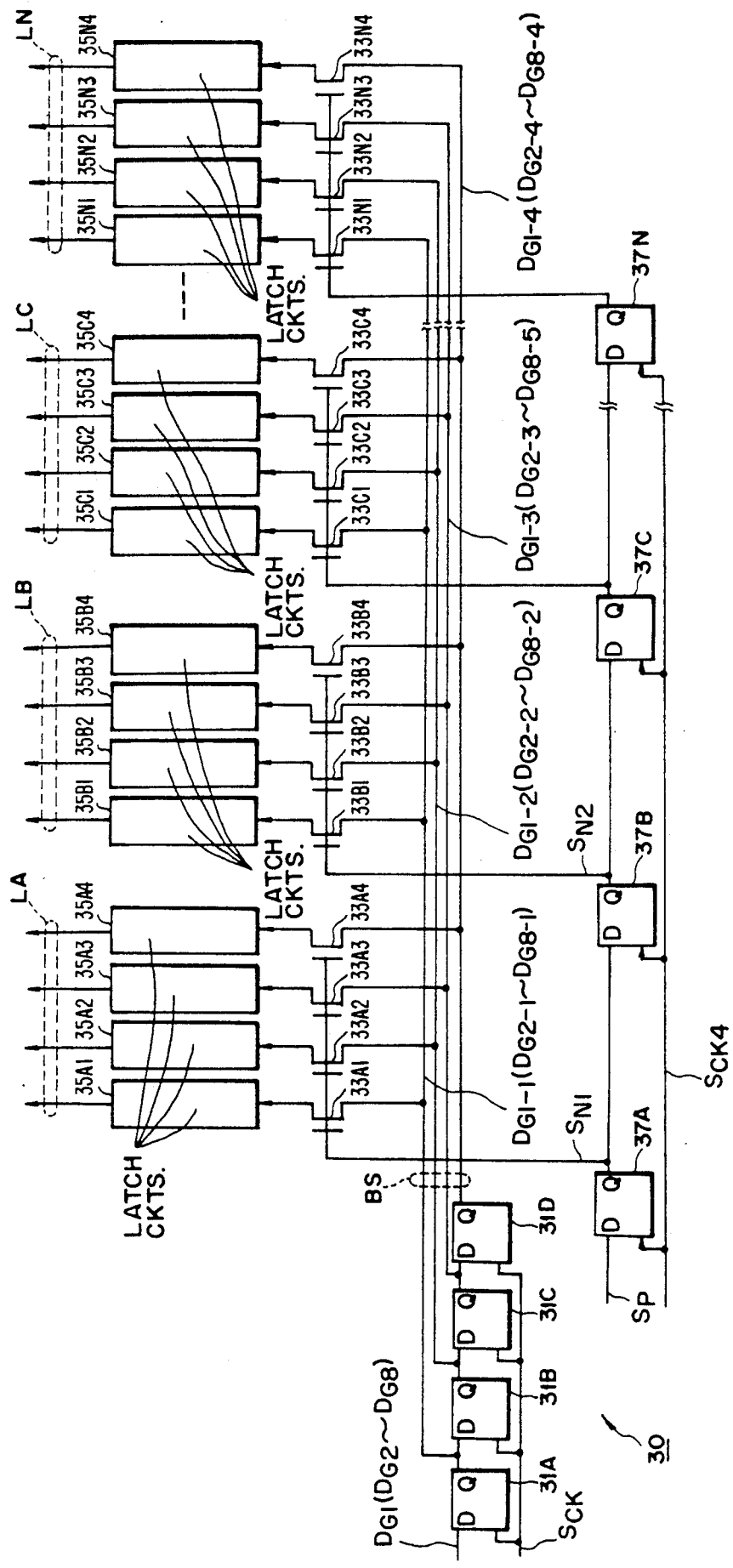
FIG. 1 is a block diagram showing an embodiment of a serial/parallel conversion circuit according to the present invention.
Figure 4:
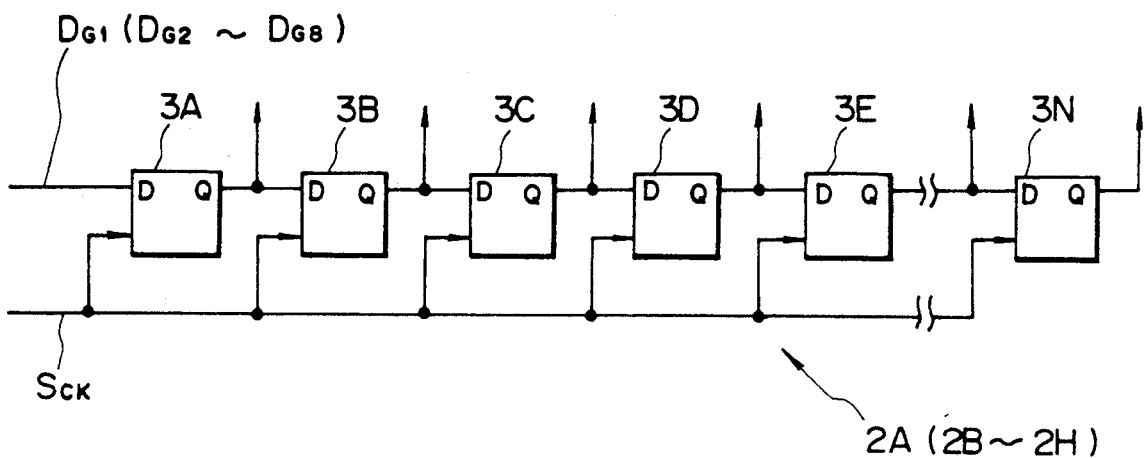
FIG. 4 and FIG. 5 are block diagrams showing a prior art serial/parallel conversion circuit.
Figure 5:
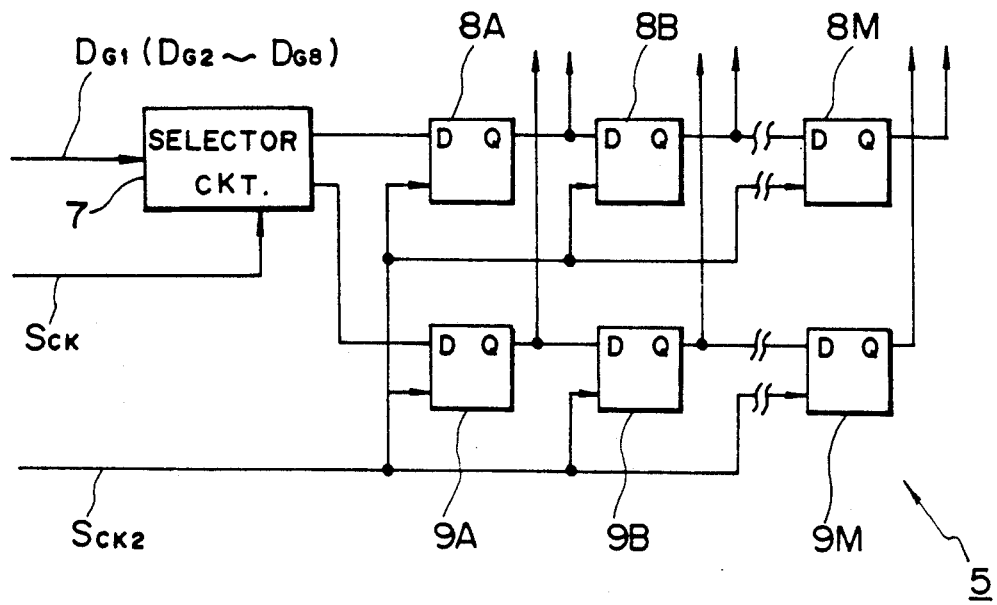
Figures 6A, 6B:
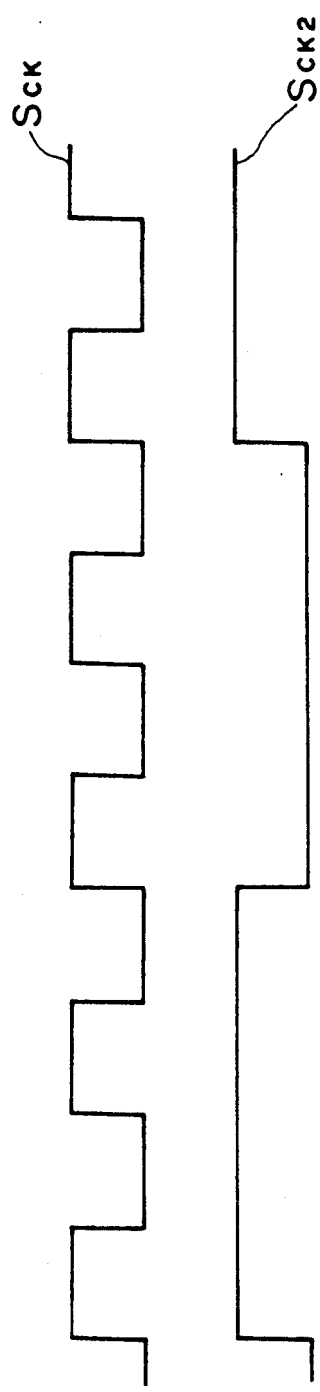
FIGS. 6A and 6B are signal waveform charts used for explaining operation of the device in FIG. 5.

Referring to FIG. 1, reference numeral 30 denotes the whole of a serial/parallel conversion circuit, used in place of the serial/parallel conversion circuits 2A-2H of FIG. 4, constituting an overall input circuit.

Figure 2:
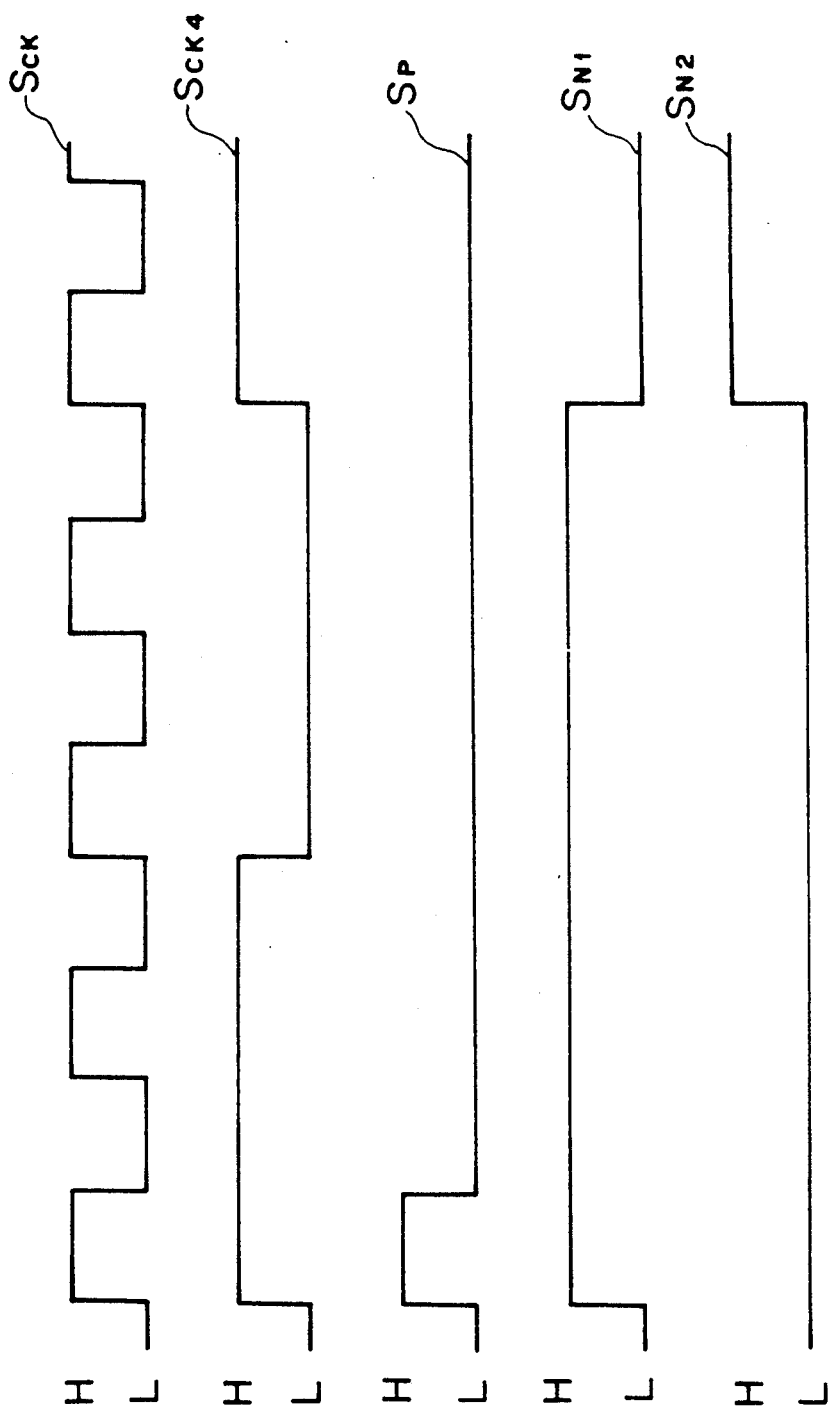
FIGS. 2(A) to 2(E) are signal waveform charts used for explaining operation of the same.

In four D flip-flop circuits 31A to 31D connected in series and adapted to acquire data at the timing synchronized with the clock signal $S_{CK}$ (FIG. 2(A)) of the image data $D_G$, data $D_{G1}$ is supplied to the D flip-flop circuits 31A at one end.

Consequently, the data $D_{G1}$ is sequentially transferred to adjoining D flip-flop circuits from the D flip-flop circuit 31A at one end toward the D flip-flop circuit 31D at the other end, at the timing of the clock signal $S_{CK}$, and the data $D_{G1-1}$ to $D_{G1-4}$ transferred from the D flip-flop circuits 31A to 31D, respectively; are output to four data bus lines BS.

Hence, by arranging such that the data $D_{G1-1}$ to $D_{G1-4}$ are taken in at the low frequency corresponding to $\frac{1}{4}$ of the clock signal $S_{CK}$, it is possible to obtain parallel data which are converted from each of the data $D_{G1}$ to $D_{G8}$ at a low frequency which is $\frac{1}{4}$ of the transfer rate of the image data $D_G$.

In the present embodiment, the data $D_{G1-1}$ to $D_{G8-4}$ are further subjected to serial/parallel conversion processing and thereby converted into data with a still lower frequency.

More particularly, N sets of D flip-flop circuits 37A to 37N are connected in series and adapted to be driven based on a clock signal $S_{CK4}$ (FIG. 2(B)) with a frequency of $\frac{1}{4}$ of the clock signal $S_{CK}$, and further, it is adapted such that a pointer signal Sp (FIG. 2(C)), which goes high at intervals of N periods of the clock signal $S_{CK4}$ in synchronism with the clock signal $S_{CK}$, is supplied to the D flip-flop circuit 37A at one end.

Thence, the pointer signal Sp is sequentially transferred to the adjoining D flip-flop circuit at the timing synchronized with the clock signal $S_{CK4}$, and thereby outputs $S_{N1}$, $S_{N2}$, ... (FIG. 2(D) and (E)) of the D flip-flop circuits 37A to 37N are caused to go high sequentially in synchronism with the clock signal $S_{CK4}$.

On the other hand, the four data bus lines BS are each connected with N gate circuits 33A1-33N4, and these gates are each adapted to open when the output of the corresponding D flip-flop circuit 37A-37N goes to logic "H" level.

Consequently, in accordance with the successive transfer of the pointer signal Sp at the timing in synchronism with the clock signal $S_{CK4}$, the N gate circuits 33A1-33N4 connected with each of the data bus lines BS are controlled such that only one set of the gate circuits 33A1 to 33N4 are sequentially turned ON. Thus, the data $D_{G1-1}$ to $D_{G1-4}$ output to their respective data bus lines BS are made sequentially obtainable from the gate circuits 33A1-33N4 at intervals of four periods of the clock signal $S_{CK}$.

Hence, by arranging that the output data from each of the D flip-flop circuits 37A to 37N are separately supplied to the control terminals of groups of four gate circuits 33A1 to 33A4, 33B1 to 33B4, ... 33N1 to 33N4, it is possible to acquire the data $D_{G1-1}$ to $D_{G1-4}$, which are output to the data bus lines BS, at intervals of N times the period of the clock signal $S_{CK4}$.

Figure 3:
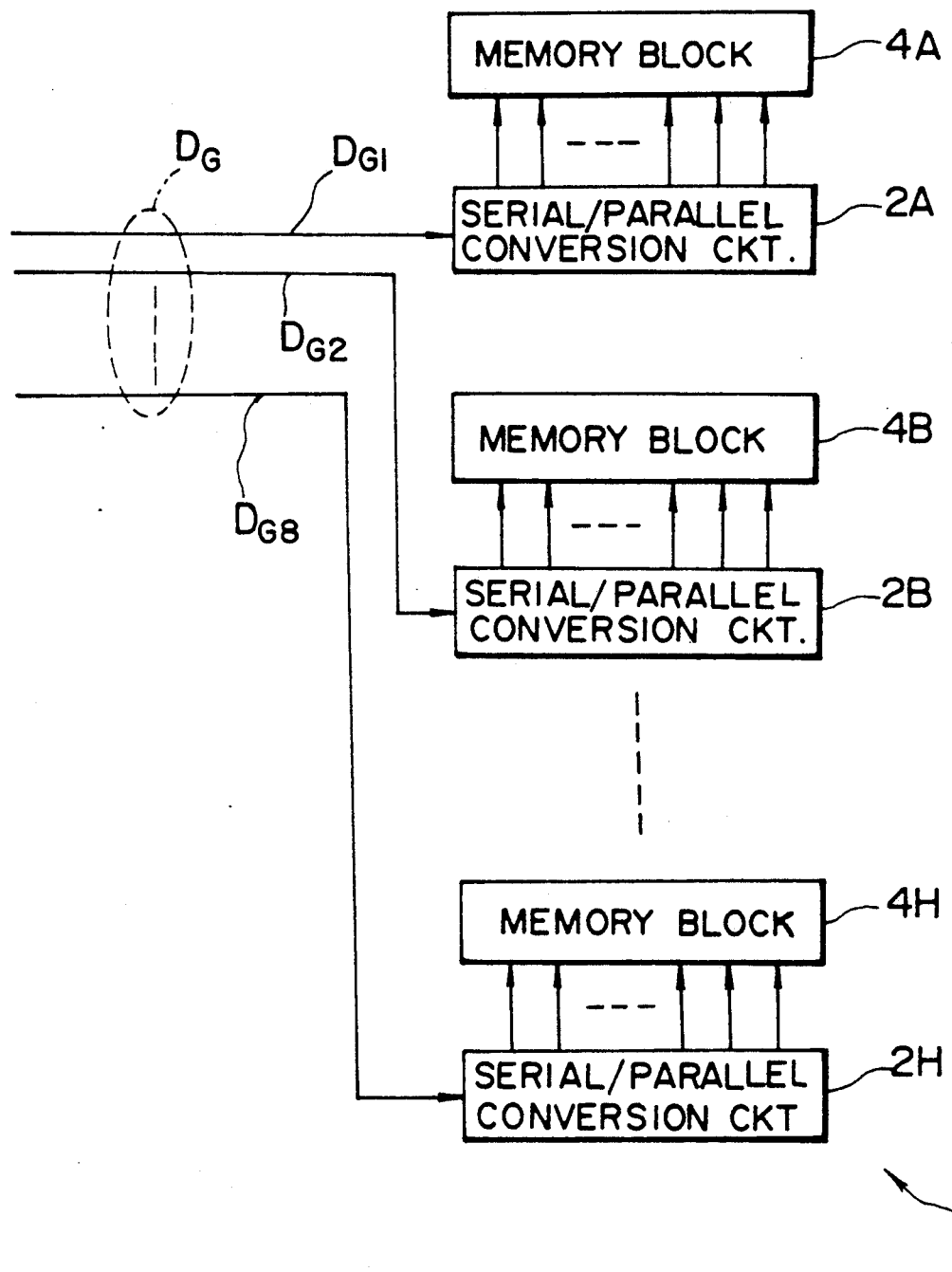
FIG. 3 is a block diagram showing a prior art memory circuit.

For that purpose, in the present embodiment, latch circuits 35A1 to 35N4 are used so that the data obtained through the gate circuits 33A1 to 33N4 are latched thereto and their output data are delivered to a memory block 4A (FIG. 3) through bus lines LA, LB, LC, ... LN.

In this way, the period of the clock signal $S_{CK4}$ can be set to four times the period of the clock signal $S_{CK}$ and the consumed current can be reduced accordingly.

Figure 7:
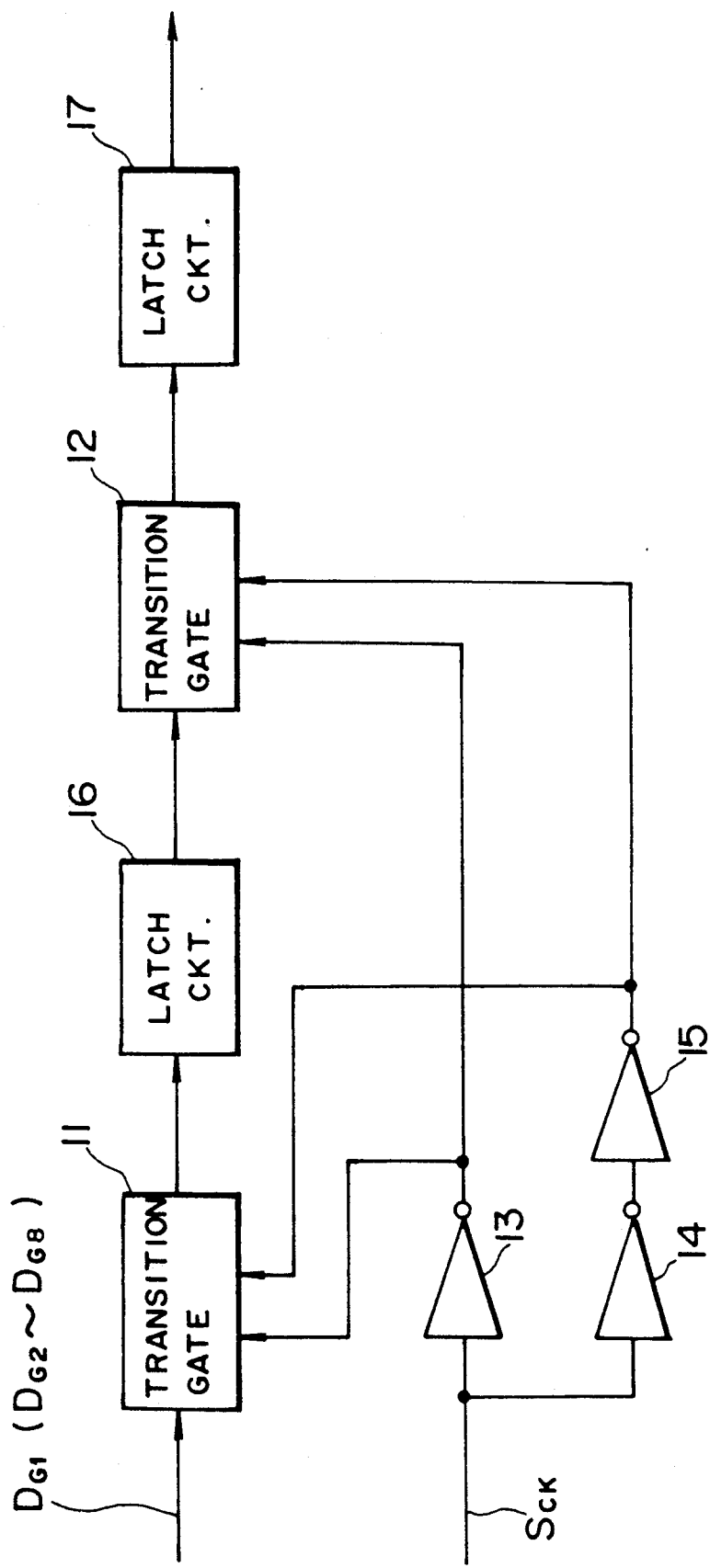
FIG. 7 is a block diagram showing a prior art D flip-flop circuit.

Further, in the present case, the latch circuits 35A1 to 35N4 connected with the bus lines LA, LB, LC, ... LN and the gate circuits 33A1 to 33N4 can be structured of the latch circuit 16 or 17 and the transition gate 11 or 12 of the D flip-flop circuit (FIG. 7).

Therefore, an input circuit capable of processing 8-bit image data can be structured of N sets by 1 system of D flip-flop circuits 37A to 37N and 4 sets of D flip-flop circuits 31A to 31D, and N sets by 8 systems of latch circuits 35A1 to 35N4 and gate circuits 33A1 to 33N4, each set thereof being made up of 6 transistors, and thus the instantaneous current can be reduced and, when arranged in the form of an integrated circuit, the area on the chip occupied by these elements can be reduced, accordingly.

To be concrete, when it is intended to obtain data with a repetition frequency the same as in the input circuit of the prior art using 700 D flip-flop circuits, the number of required transistors could be reduced to approximately $\frac{1}{2}$.

Thus, while the data bus lines BS constitute a first data line for receiving the image data $D_G$ through the D flip-flop circuits 31A to 31D, each of the bus lines LA, LB, LC, ... LN constitutes a unit data line made up of the same number of lines as that of the data bus lines BS, and the bus lines LA, LB, LC, ... LN as a whole constitute a second data line including a plurality of unit data lines.

Further, while the latch circuits 35A1 to 35N4 and the gate circuits 33A1 to 33N4 constitute switch means connecting the data bus lines BS with each of the bus lines LA, LB, LC, ... LN, the D flip-flop circuits 37A to 37N constitute control means for controlling the switch means such that one set each of the gate circuits 33A1 to 33N4 is sequentially turned ON at intervals of the period of the data $D_{G1-1}$ to $D_{G8-4}$ input to the data bus lines BS.

According to the above described arrangement, by changing over input data sequentially and cyclically with the use of the switching means and outputting them to a plurality of bus lines, an input circuit having a lower repetition frequency and using a smaller number of transistor as a whole can be structured. When it is arranged in the form of an integrated circuit, it can be of a smaller size, consuming less power, and drawing a smaller instantaneous current.

Although the embodiment was described above relative to the case where the present invention was applied to an input circuit, the present invention is not limited to that but can be applied also to an output circuit.

More particularly, it can be arranged such that data with a low frequency are latched through bus lines LA, LB, LC, ... LN and then cyclically output to data bus lines BS. Further, the data output to the data bus lines BS are converted into serial data to be output. Thus, these circuit elements can be arranged in the form of a smaller sized integrated circuit, consuming less power, and drawing a smaller instantaneous current.

Although the above embodiment was described relative to the case where the image data are transferred between the D flip-flop circuits 31A-31D and the data were thereby switched over to the data bus lines BS bit by bit, the present invention is not limited to such an arrangement but, by preparing eight bus lines for the data bus line BS, the 8-bit image data may be input directly to these bus lines.

Although the above embodiment was described relative to the case where the present invention was applied to a memory circuit of image data, the present invention is not limited to that of image data but is widely applicable to memory circuits of various data.

Further, the present invention is not only applicable to an input/output circuit for a memory circuit but is also applicable widely to input/output circuits for various data processing circuits.

According to the present invention as described above, data are sequentially output to or input from a plurality of bus lines by adapting such that each set of gate circuits is sequentially switched over, and thus, an input/output circuit having a low repetition frequency and using a smaller number of transistors as a whole can be structured and, when it is arranged in the form of an integrated circuit, it can be of a smaller size, consume less power, and draw a smaller instantaneous current.

Additionally, by using an input protection circuit as described below between an internal circuit including the above described input/output circuit and the input terminal, thermal destruction of the internal circuit (especially, bypassing MOS transistors) due to abnormal voltages such as surge voltages can be effectively prevented.

Figure 8A:
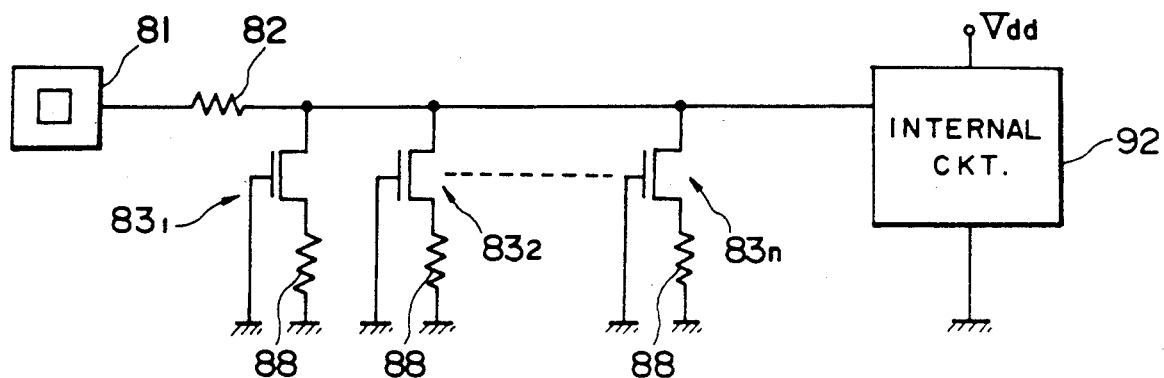
Figure 8B:
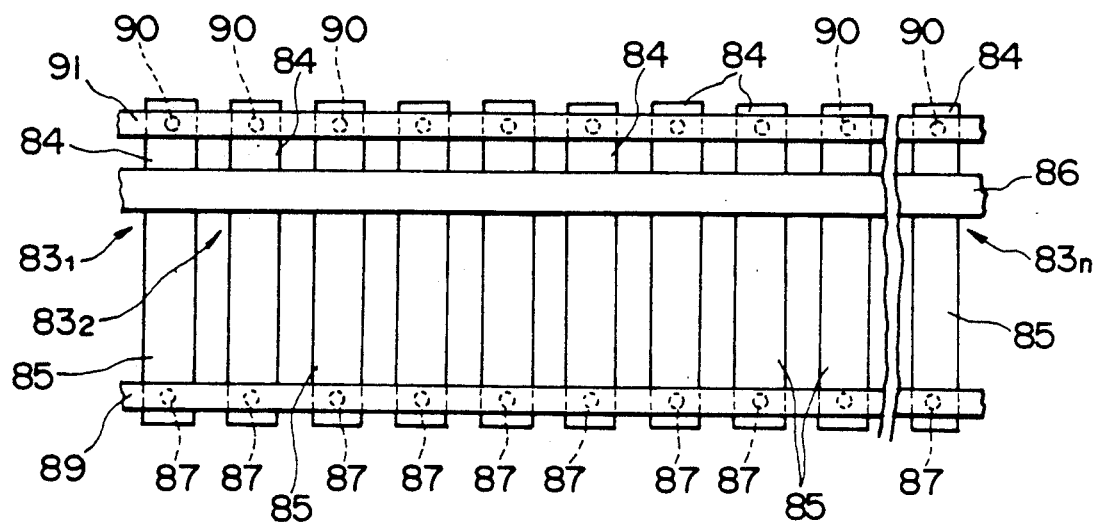

FIGS. 8(A) and 8(B) show an embodiment of the input protection circuit of the present invention, of which FIG. 8(A) is a circuit diagram and FIG. 8(B) is a plan view of MOS transistors. Referring to the figures, reference numeral 81 denotes an input terminal and 82 denotes an input protection resistor, whose one end is connected with the input terminal 81. Reference numerals $83_1, 83_2, \ldots 83_n$ (n represents the number, for example, of units, tens, or hundreds) denote MOS transistors, whose drains 84 are connected with the input protection resistor 82 at its terminal at the side opposite to the input terminal, while whose sources 85 and common gate 86 are grounded. The sources 85 are rather elongated, as compared with the drains 84, along the length of the channel (the length from top to bottom in FIG. 8(B)) and source electrodes 87 are taken out from the end portions of the sources 85 at the side distant from the gate, whereby it is adapted such that diffused resistors 88 are formed by source diffused layers at the side of the source. Reference numeral 89 denotes a source wiring, which is grounded. Reference numerals 90 denote drain electrodes and 91 denotes a drain wiring, which is connected between the terminal of the input protection resistor 82 at the side opposite to the input terminal and the input of an internal circuit 92.

Figure 9:
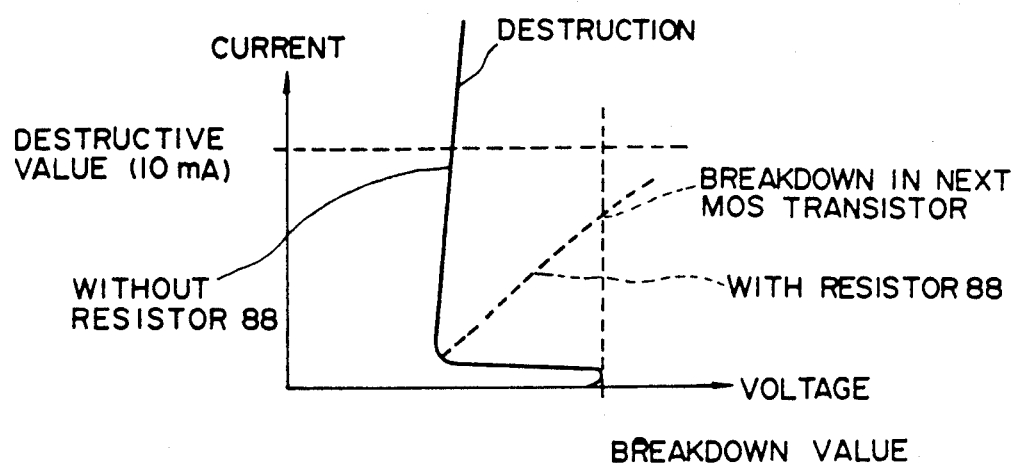
FIG. 9 is a breakdown characteristic of the device in FIG. 8(A)

In the present input protection circuit, the MOS transistors $83_1, 83_2, \ldots 83_n$ are in an OFF state in the normal condition. When an abnormally high voltage is applied between the input terminal and the ground line, the abnormal voltage comes to be impressed on all the MOS transistors $83_1$ to $83_n$ through the resistors 88. Then, avalanche breakdown caused by the voltage occurs in all the MOS transistors $83_1$ to $83_n$, whereby the resulting current is caused to flow separately through each of the MOS transistors $83_1$ to $83_n$. At this time, concentration of the current onto a part is prevented by the presence of the resistors 88. On this action, explanation will be given below with reference to FIG. 9 which is a breakdown characteristic.

When subjected to an abnormal voltage, a MOS transistor exhibits a voltage-current characteristic as indicated by the solid line. More particularly, when an abnormal voltage is applied, the terminal voltage increases until it reaches the breakdown voltage. Breakdown occurs at this point, and the flowing current at this time is virtually zero. Instantly, the terminal voltage shows a sharp drop to a low value, and thereupon, the current starts to increase steadily, while the terminal voltage exhibits virtually no change, and when the current value exceeds the destructive value (e.g., 10 mA), destruction occurs. In the case of the present invention, however, since there is the resistor 88 connected in series with any of the MOS transistors 83, the terminal voltage of the resistor 88 increases with the increase in the current following the sharp drop in the voltage due to the avalanche breakdown (refer to the indication by a broken line). Then, this increase in the terminal voltage leads to an increase in the terminal voltage of another MOS transistor 83, because the series circuits of the transistor and the resistor are all connected in parallel. Hence, before thermal destruction is caused on the MOS transistor which has caused the avalanche breakdown, the terminal voltage of another MOS transistor 83 will exceed the breakdown value, whereby this MOS transistor may also cause breakdown and thereby this MOS transistor 83 also conducts a current. In this manner, the MOS transistors 83 cause one breakdown after another, like in a chain reaction, allowing the current to flow therethrough. All such actions take place in a very short period of time, or virtually instantaneously. Hence, all the MOS transistors 83 experience the avalanche breakdowns almost simultaneously, whereby the current due to the abnormal voltage is caused to flow separately through all the MOS transistors 83. Thus, the internal circuit 92 can be protected from thermal destruction.

Figure 10:
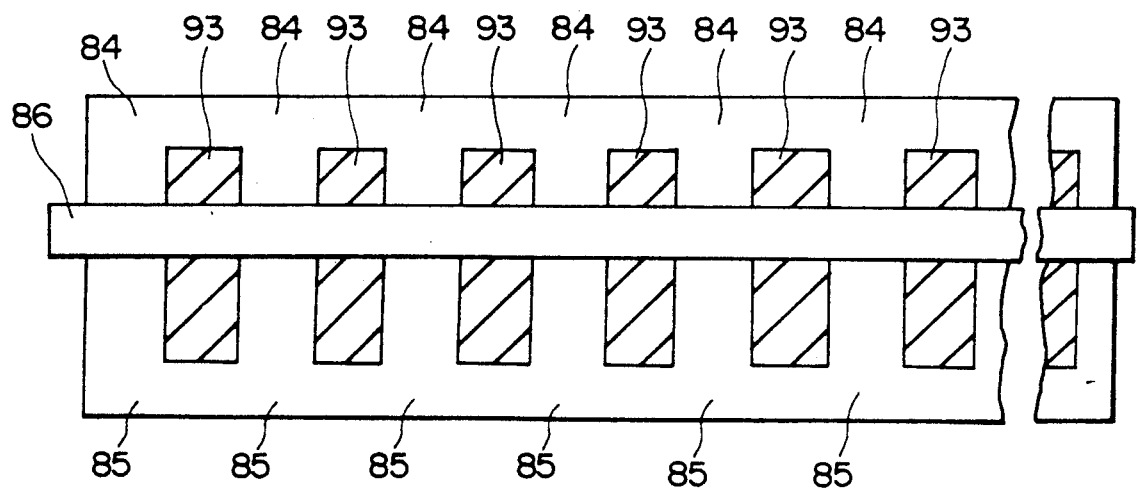
FIG. 10 is a plan view of MOS transistors showing another embodiment of an input protection circuit according to the present invention.

FIG. 10 is a plan view showing another embodiment of the input protection circuit. In the present input protection circuit, the source and the drain of a plurality of MOS transistors are each formed of a diffused layer, and there are formed insulating films (LOCOS) 93, which traverse the gate 86 when viewed from above, so that each of the diffused layers are substantially separated into divisions, whereby a plurality of MOS transistors are substantially provided.

Although, in the above described embodiments, the resistor 88 in series connection with each MOS transistor 83 is connected at the side of the source, it need not necessarily be connected that way but it can be connected at the opposite side, the side of the drain. Or, resistors may be connected at both the drain side and the source side. In effect, it meets the purpose if a resistor or resistors 88 are connected in series with each MOS transistors 83.

In the above described embodiments, the MOS transistors 83 were of the n-channel MOS type and hence the gate of each of the MOS transistors was grounded. In the case where transistors of the p-channel type are used, the gate of each of the MOS transistors will be connected with the power supply line (Vdd).

Although, the above described embodiments were for protecting the internal circuit from an abnormal voltage applied between the input terminal 81 and the ground, it is of course possible to apply the present invention to an input protection circuit for protecting the internal circuit from an abnormal voltage applied between the power supply line (Vdd) and the input terminal 81.

As described so far, the input protection circuit of the present invention is characterized in that there is provided an input protection resistor between an input terminal and an internal circuit, a plurality of series circuits of a MOS transistor and a resistor are arranged in parallel and connected between the wiring connecting the input protection resistor with the internal circuit and a fixed-potential point, and a predetermined voltage is supplied to the gate of the MOS transistors.

According to the input protection circuit of the present invention, since the plural MOS transistors are each provided with the resistor connected in series, and such series circuits of the MOS transistor and the resistor are connected in parallel, concentration of the current onto a part can be prevented by each of the resistors, and it is thereby attained to have avalanche breakdown take place in each of the MOS transistors. Thus, destruction by heat due to current concentration can be prevented from occurring.

What is claimed is:

1. An input/output circuit comprising:
   a first data line including a plural number of first unit data lines;
   a second data line including plural sets of second unit data lines, each set of second unit data lines being formed of an equal number of lines as the number of first unit data lines forming the first data line;
   switch means for selectively coupling the first unit data lines with corresponding ones of the second unit data lines;
   latch circuits provided between the switch means and the second data line; and
   control means for controlling the switch means to turn on, such that at least one set of the second unit data lines of the second data line is sequentially coupled with the first data line.

2. An input/output circuit according to claim 1, wherein a serial input to the input/output circuit is adapted to be input to the second data line as a parallel input.

3. An input/output circuit according to claim 1, wherein a parallel output from the second data line is adapted to be output from the input/output circuit as a serial output.

4. An input/output circuit according to claim 1, wherein the control means is formed of flip-flop circuits.

5. An input/output circuit as recited in claim 1, further comprising:
   a third data line formed of one line; and
   serial/parallel conversion means connecting the first data line with the third data line.

6. An input/output circuit comprising:
   a first data line including a plural number of first unit data lines;
   a second data line including plural sets of second unit data lines, each set of second unit data lines being formed of an equal number of lines as the number of first unit data lines forming the first data line;
   switch means connecting the first unit data lines with corresponding ones of the second unit data lines;
   control means for controlling the switch means to turn on, such that at least one set of the second unit data lines of the second data line is sequentially coupled with the first data line;
   a third data line formed of one line;
   serial/parallel conversion means connecting the first data line with the third data line; and
   wherein the third data line is connected with an input protection circuit comprising:
   an input terminal;
   a circuit ground terminal;
   an input protection resistor provided between the input terminal and the third data line; and
   a plurality of circuits connected in parallel between the third data line and the circuit ground terminal, each of the plurality of circuits including a MOS transistor and a resistor connected in series.

7. An input/output circuit according to claim 6, wherein a gate of the MOS transistor is provided with a predetermind potential.

* * * * *